United States Patent [19]
Mei et al.

[11] Patent Number: 5,821,135
[45] Date of Patent: Oct. 13, 1998

[54] METHODS FOR AND APPLICATIONS OF MAKING BURIED STRUCTURES IN SEMICONDUCTOR THIN FILMS

[75] Inventors: Ping Mei, Palo Alto; Gregory B. Anderson, Woodside; James B. Boyce, Los Altos; David K. Fork, Palo Alto; Richard I. Johnson, Menlo Park, all of Calif.

[73] Assignee: Xerox Corporation, Stamford, Conn.

[21] Appl. No.: 730,981

[22] Filed: Oct. 16, 1996

[51] Int. Cl.$^6$ .............................. H01L 21/00; H01L 21/84
[52] U.S. Cl. .............................. 438/57; 438/89; 438/158; 438/487
[58] Field of Search .................................. 438/30, 57, 89, 438/158, 487, 799

[56] References Cited

U.S. PATENT DOCUMENTS

| | | |
|---|---|---|
| 4,341,569 | 7/1982 | Yaron et al. .............................. 219/121 |
| 5,013,670 | 5/1991 | Arikawa et al. .............................. 437/2 |
| 5,358,925 | 10/1994 | Connell et al. . |
| 5,366,926 | 11/1994 | Mei et al. . |
| 5,407,845 | 4/1995 | Nasu et al. .............................. 437/40 |

*Primary Examiner*—Jey Tsai
*Assistant Examiner*—Michael S. Lebentritt
*Attorney, Agent, or Firm*—Fay, Sharpe, Beall, Fagan, Minnich & McKee

[57] ABSTRACT

A transparent substrate as formed on its front side a layer of amorphous silicon. A laser beam is used to irradiate through the backside of the transparent substrate in order to form buried nucleation sites within the amorphous silicon. The buried nucleation sites which are used as nucleation seeds are then used during a front side crystallization process in order to form large single silicon crystals over the substrate surface.

19 Claims, 7 Drawing Sheets

METHODS FOR AND APPLICATIONS OF MAKING BURIED STRUCTURES IN SEMICONDUCTOR THIN FILMS

BACKGROUND OF THE INVENTION

This invention pertains to the art of semiconductor thin film fabrication and more particularly to a method for producing buried nucleation sites in a semiconductor thin film matrix for forming single silicon crystals by laser crystallization.

As the demand for higher performance two-dimensional arrays used in devices such as displays and scanners increases, the requirements for higher performance thin film transistors (TFTs) to integrate high speed electronic circuits with the two-dimensional arrays also increase. However, because conventional TFTs are manufactured using polycrystalline silicon thin films having small grain sizes, the performance of conventional TFTs is limited by undesirable low field-effect mobilities inherent in these polycrystalline silicon thin films.

Field-effect mobilities are reduced by grain boundaries. Thus, if the polycrystalline silicon film contains large grain sizes, then the number of grain boundaries per unit area is reduced and the field-effect mobility is improved. Accordingly, many efforts have been advanced to increase field-effect mobilities by producing polycrystalline silicon thin films having large crystal grain sizes so that greater performance polycrystalline silicon TFTs may be obtained.

One attempt to increase polycrystalline silicon grain sizes relies on solid phase crystallization in which an entire assembly (i.e., the substrate and deposited films) is heated at high temperatures for many hours to encourage large crystal growth. However, solid phase crystallization has several drawbacks: (1) throughput is low because a large amount of time is required to form large crystal grains; and (2) glass substrates are subjected to high temperatures causing adverse effects such as warping and bending of the glass substrates.

Besides having small grain sizes, the polycrystalline silicon films formed by prior processes also have a problem of varying grain densities. Since polycrystalline silicon grains are formed randomly, there is no control of the number of grains formed or the distribution of grain sizes. In fact, many polycrystalline silicon films have greatly varying grain sizes. The performance of TFTs formed in these polycrystalline silicon films strongly depends on the locations of the devices since grain size and density vary greatly over the substrate area.

In consideration of the above, attention has turned to finding methods for forming a plurality of single silicon crystals over a substrate. Such methods include forming a plurality of silicon nucleation sites over the substrate using laser crystallization. Laser crystallization is useful, since it is known that in the crystallization process the size of the grain corresponds to energy applied during crystallization, as generally illustrated in FIG. 1. Particularly, as, for example, the laser energy level increases the grain size correspondingly increases until reaching a peak laser energy value 10 for grain size growth. Increased laser energy levels thereafter resulting in a decrease in grain size.

U.S. patent application Ser. No. 08/485,847 of Nickel, et al., entitled, Method For Forming Single Silicon Crystals Using Nucleation Sites, describes methods for forming single silicon crystals by the use of the laser formed nucleation sites. FIGS. 2A–2E illustrate a method of forming single silicon crystals according to the teachings of Nickel, et al. In FIG. 2A, an amorphous silicon layer 12 is formed over substrate 14. As shown in FIG. 2B, amorphous silicon layer 12 is melted and crystallized using laser beam 16 to form polycrystalline silicon layer 18. The polycrystalline silicon layer 18 is patterned and etched to form nucleation seeds 20, 22 and 24 at desired locations on substrate 14 (FIG. 2C), where nucleation seeds 20, 22 and 24 are used as seed columns for desired grain growth.

After seed columns 20, 22 and 24 are formed, an amorphous silicon layer 26 is formed over substrate 14 and over seed columns 20, 22 and 24 using conventional methods (FIG. 2D). As illustrated in FIG. 2E, amorphous silicon layer 26 is crystallized using laser beam 28, and single silicon crystals 29a, 29b and 29c are formed corresponding to seed columns 20, 22 and 24, respectively.

The growth of large silicon grains 29a–29c occurs since grains along the perimeter of nucleation sites 20–24 serve as nucleation seeds. When the silicon of a-Si layer is melted and then cooled, the silicon begins to crystallize from each nucleation seed. As crystals grow from adjacent nucleation seeds in a direction radially away from nucleation sites 20–24, more silicon is available to be crystallized because of the expanding circumference. Thus crystals from adjacent nucleation seeds have more silicon to crystallize before the crystal boundaries of the adjacent crystals interfere with each other.

As discussed above, large silicon grains form around the perimeter of the polycrystalline seed columns. However, because the seed columns 20, 22 and 24 are each a single silicon crystal, a single crystal of silicon is formed emanating from the seed columns 20, 22 and 24. In FIG. 2E, seed columns 22 and 24 are so close to each other that the single crystals formed by the seed columns 22 and 24 grow until the crystal grain boundaries of the single crystals emanating from seed columns 22 and 24 meet at the crystal grain boundary 27. The crystal columns 20 and 22 are far apart from each other. Thus, small grains 25 form spontaneously separating the crystal grain boundaries of the crystals corresponding to seed columns 20 and 22.

Additional processes taught by Nickel, et al. includes using a plurality of interfering laser beam arrays to form a plurality of nucleation seeds.

The methods of Nickel, et al. are directed to overcoming the inhomogeneity of laser crystallized polysilicon (poly-Si) films. It is recognized that this inhomogeneity is one of the bottlenecks in the development of large-area poly-Si LCD and image scanner applications. The inhomogeneity being due mainly to the random location of grains and wide distribution in the grain size.

The quality and uniformity of a crystallized poly-Si thin film over a large-area depends on the size and distribution of the grains. For amorphous substrates, the size and distribution of the grains are controlled by the nucleation rate and a grain growth rate which are functions of temperature. Therefore, in an ideal situation, it is desirable to slow down the nucleation rate and enhance the growth rate to obtain high quality films.

In the approaches of Nickel, et al. and other known methods, nucleation seeds are artificially planted at desired locations with desired sizes. Thereafter, during the subsequent film crystallization these seeds serve as the initiation point for grain growth and, if the growth rate is faster than the nucleation rate, the grain boundary is formed at the middle of two seeding sites.

Thus, existing methods of nucleation seeding including those discussed, include implanting ions (Si) to selectively amorphize poly-Si film. The unimplanted region provides the nucleation sites. With a subsequent solid-phase regrowth, large grains are formed around the planted sites. In another method, the nucleation seeds are produced by excimer laser photolysis of the precursor during chemical vapor disposition (CVD) film growth. A third process utilizes an interference pattern of an optical system to selectively crystallize the film. When producing the nucleation sites by laser crystallization, the thin film is patterned and then covered by a thicker film. The patterned region provides the seeds for grain growth in the thicker film.

A disadvantage of the above methods, is that they require a two-step layer formation process including the growth of a first thin film layer, (e.g. 12 in FIG. 2A), a step of crystallizing this first layer in a desired pattern, and then growing a second thicker layer, (e.g. 26 in FIG. 2D), thereon. The methods, therefore, require a complex, time consuming process to obtain the desired nucleation seeding.

Another disadvantage of the known processes is that the surface on which the second layer is grown may not be sufficiently clean such that oxides or other impurities may exist between the surface of the first layer and the second layer resulting in contamination of the film.

Still a further drawback of these processes is that if the first deposited amorphous silicon layer is too thick, the laser beam may not be able to melt through the first deposited amorphous silicon layer resulting in smaller polycrystalline silicon grains.

However, if the first amorphous silicon layer is too thin, not enough silicon is present to generate large polycrystalline silicon grains. In addition, the laser beams often cause ablation of the thin amorphous silicon film because it is difficult to adjust the laser fluence to melt only the thin amorphous silicon film, resulting in undesirable delamination of the polycrystalline silicon layer from the substrate.

Therefore, it has been deemed desirable to find a simplified seeding method that results in the growth of large grain size at predetermined locations, and which avoids the introduction of impurities which cause contamination of the film.

SUMMARY OF THE INVENTION

The present invention contemplates a new and improved method for making buried structures in semiconductor thin films using laser irradiation and appropriate masks on the backside of the semiconductor thin film.

In a more limited aspect of the present invention, the method includes constructing buried nucleation sites in an amorphous semiconductor matrix.

According to another aspect of the invention, the semiconductor film consists of multi-layers of materials of different melting temperatures. The combination of the backside laser irradiation and the multi-layer semiconductor structure providing preferential nucleation of single nuclei at desired sites and depths in a matrix.

With attention to yet another aspect of the present invention, the resulting buried structures result in grain growth in either 3-D or lateral dimensions with a determined size distribution.

With attention to yet still another aspect of the present invention, the buried structures for seeding grain growth are used in the fabrication of Microelectromechanical System (MEMS) structures.

With attention to yet another aspect of the present invention, the energy level required for formation of the nucleation sites from the backside of the film, is a lower energy level than the energy level required for crystallization of the amorphous silicon on the front-side of the film.

According to yet another aspect of the present invention, the mask used in the backside laser irradiation is located on the backside surface of the substrate in one alternative and another is formed at the interface between the a-Si and the substrate. In the second alternative, the mask is formed by a metal cover with dielectric film to prevent metal contamination of the a-Si film.

According to yet another aspect of the present invention, the nucleation site generation method utilizes an interference pattern formed by laser irradiation from the backside using a grating mask.

A principal advantage of the invention is the provision of a simplified method for making buried structures in semiconductor thin films, where the buried structures are nucleation sites in an amorphous semiconductor matrix. The formation of the nucleation sites created by backside laser irradiation through a desired mask located on the backside of the semiconductor thin film.

Another advantage of the present invention is a requirement of only a single layer of silicon deposited on a substrate of these semiconductor thin film in order to form nucleation sites.

A further advantage of the present invention is that backside nucleation site generation only requires the crystallization of a shallow region of the silicon layer such that seeding energy is of a much lower level than the energy required for crystallization.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof, and wherein.

DETAILED DESCRIPTION OF THE PREFERRED EMBODIMENT

Figure 1:
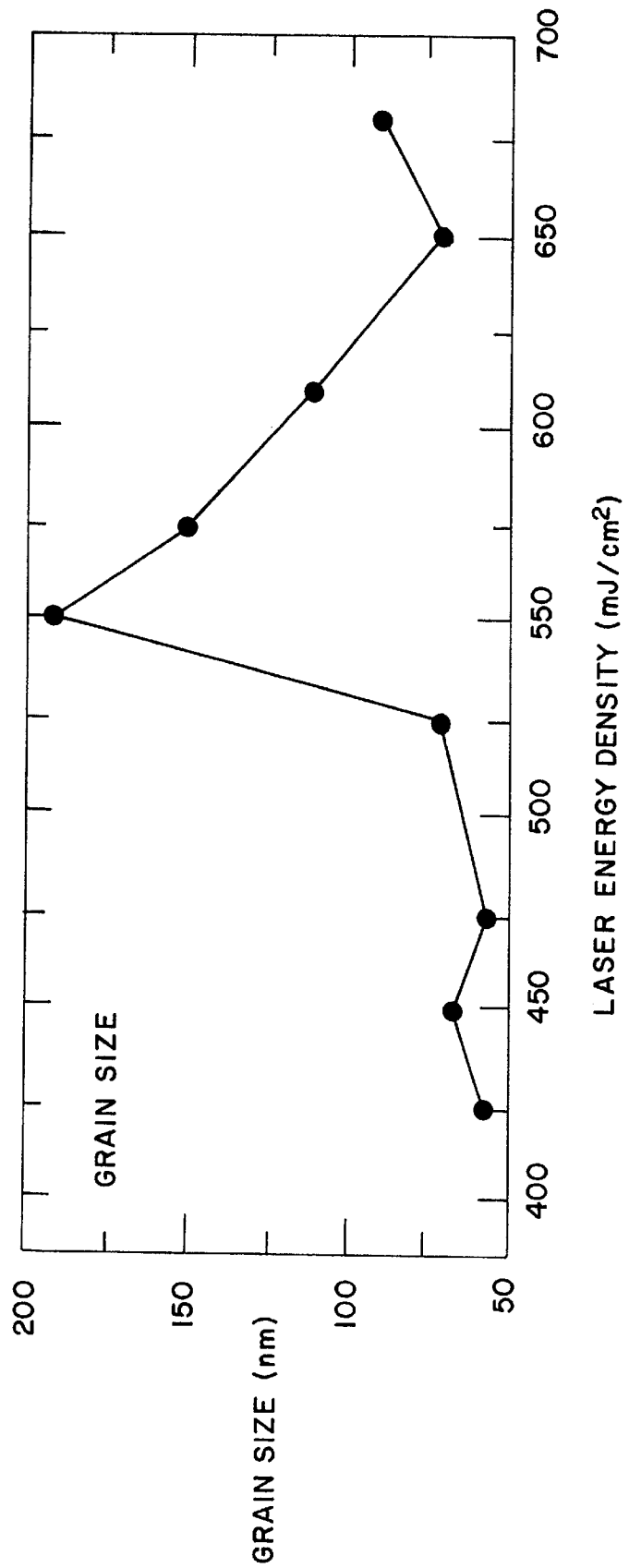
FIG. 1 is a graph showing a peak value of grain size corresponding to a peak value of laser energy.
Figure 2A:
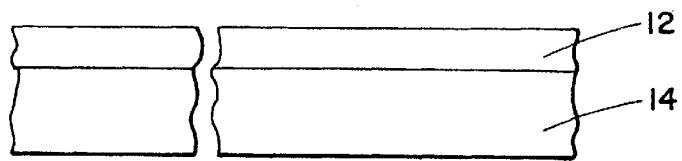
FIGS. 2A–2E illustrate formation of nucleation sites according to an existing method.
Figure 2B:
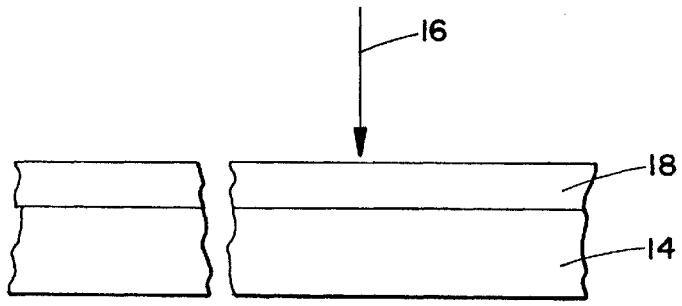
Figure 2C:
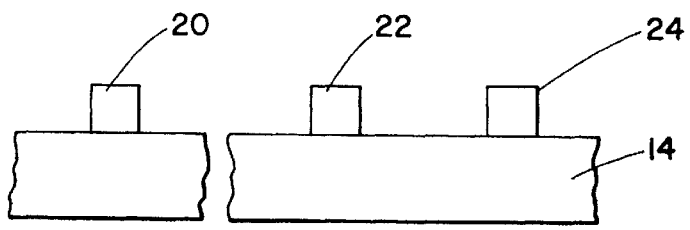
Figure 2D:
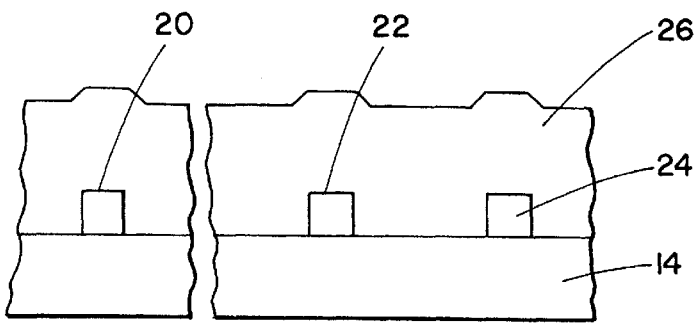
Figure 2E:
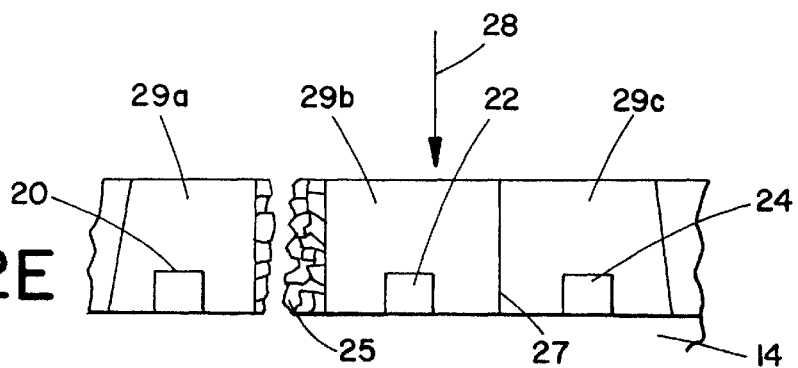

FIGS. 1 and 2 have respectively illustrated the relationship between grain size versus applied energy levels, and an existing manner of forming nucleation sites.

In FIGS. 3A–3D and 3G, preferred embodiments of the invention for forming buried nucleation sites through the use of backside laser irradiation are illustrated. In the embodiments, an amorphous silicon layer (a-Si) 40 is formed over a transparent substrate 42 such as glass or quartz, with or without transparent buffer layers by conventional methods such as low pressure chemical vapor deposition (LPCVD), plasma enhanced chemical vapor deposition (PECVD), sputtering, laser deposition, or hot wire deposition and related techniques. Unhydrogenated or hydrogenated amorphous silicon, a-Si:H, may be used to form the a-Si layer 40.

Figure 3A:
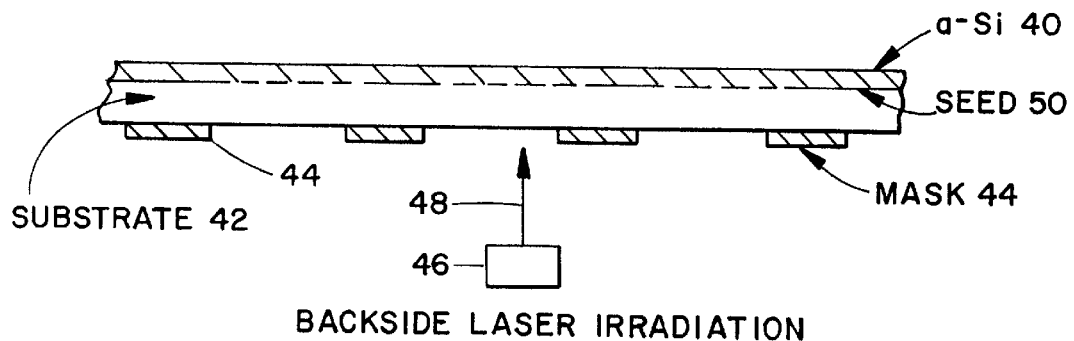
FIGS. 3A–3D and 3G illustrate embodiments of backside laser irradiation according to the subject invention.

With particular attention to FIG. 3A, on the backside of transparent substrate 42, a mask structure 44 is formed consisting of reflective or absorptive materials. The reflective materials may be commonly used Al, Cr or Cu, and the absorptive materials may be commonly used Si, SiC or SiGe, with the choice of the specific materials and thickness of the materials depending on the particular application.

Figure 4:
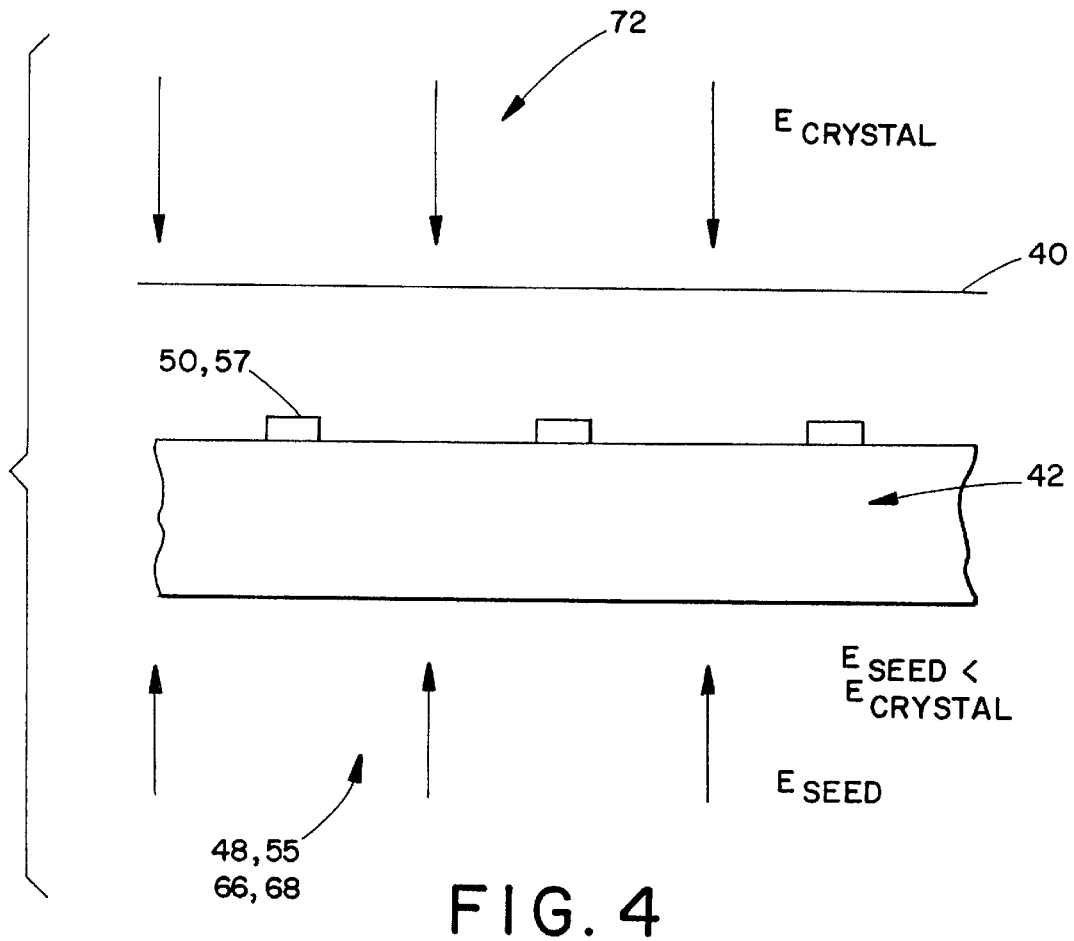
FIG. 4 details further formation of a film having varied nucleation sites generated by backside laser irradiation.

Backside excimer laser 46 provides backside excimer irradiation 48 through mask 44, producing poly-Si crystallites or nucleation seeds 50 near the interface between a-Si 40 and substrate 42, at locations selected due to the configuration of mask 44. Thereafter, as illustrated in FIG. 4, when front-side crystallization of the remaining a-Si 40 takes place, large size grain growth occurs near the predetermined locations, as described in the preceding explanation of large grain growth.

With placement of mask 44 on the backside of substrate 32, as illustrated in FIG. 3A, diffraction patterns, i.e. fringes, may complicate the contour of the desired pattern of nucleation seeds 50.

Figure 3B:
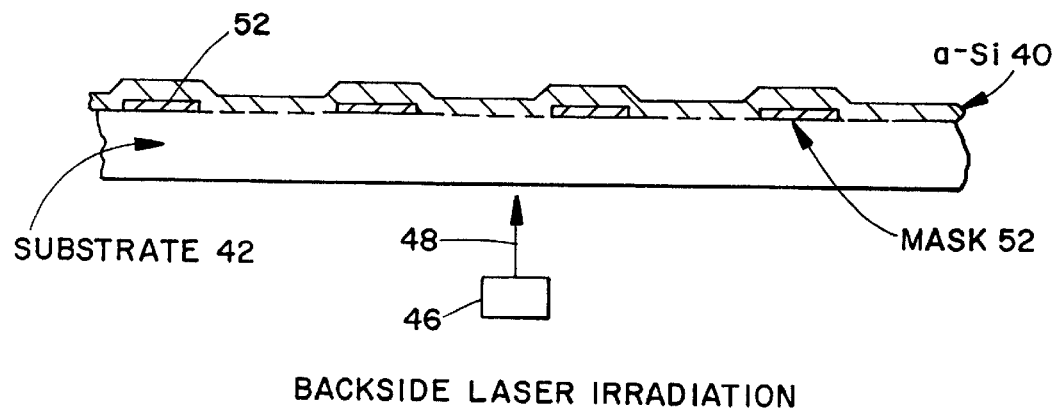

A manner in which this diffraction can be reduced or eliminated is through use of the method and structure set forth in FIG. 3B. Therein, mask 52 is formed at the interface of a-Si 40 and substrate 42. By placing the mask in closer proximity to a-Si 40 it is possible to reduce or eliminate undesired diffraction patterns. When the method and structure of FIG. 3B is implemented, mask 52 is formed of a metal structure covered with a dielectric film or in some other configuration, in order to prevent metal contamination of the a-Si film. Such a structure has great similarity to a bottom gate TFT.

Figure 3C:
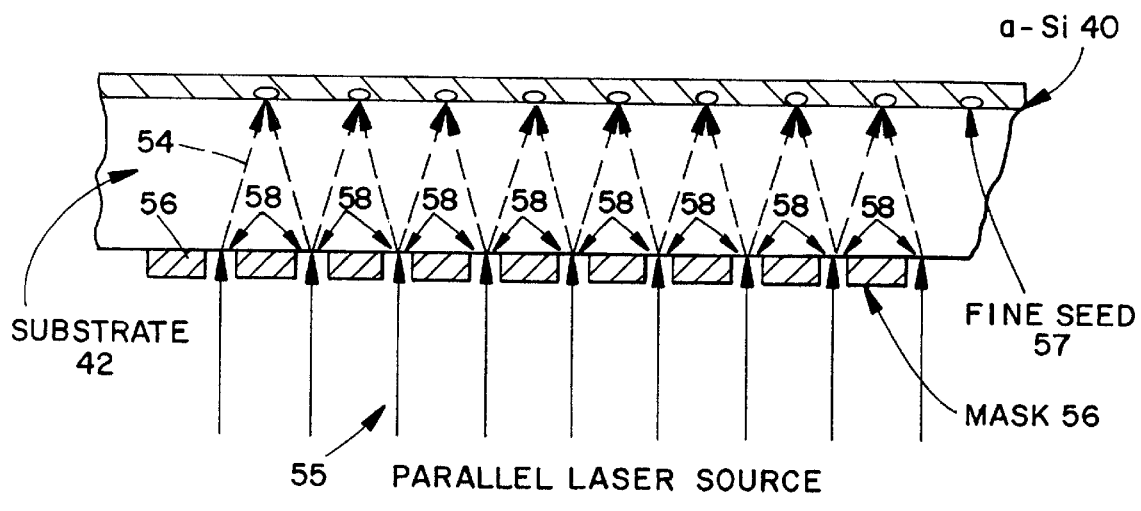

With attention to another method and structure for forming buried nucleation sites by the use of backside laser irradiation, attention is directed to FIG. 3C wherein the illustrated method and structure allows for the making of fine grain seeding patterns, in the submicron range. FIG. 3C utilizes an interference pattern 54 formed by laser irradiation, such as by a parallel laser source 55, from the backside of substrate 42 through use of grating mask 56 to form fine seeds 57. Such a grating mask may for example have 15 $\mu$m periodicity which will produce an intensity pattern of 10 $\mu$m periodicity with a parallel laser beam of 308 nm wavelength, assuming the thickness of the substrate is 0.5 mm. The width of the fine intensity pattern determined by the number of grating slits 58, and in this example, the coherence length of the light source. If the coherence length is approximately 1 mm, then the width of the fine feature on the image plane (interference between a-Si 40 and substrate 42) is less than 1 $\mu$m.

Figure 3D:
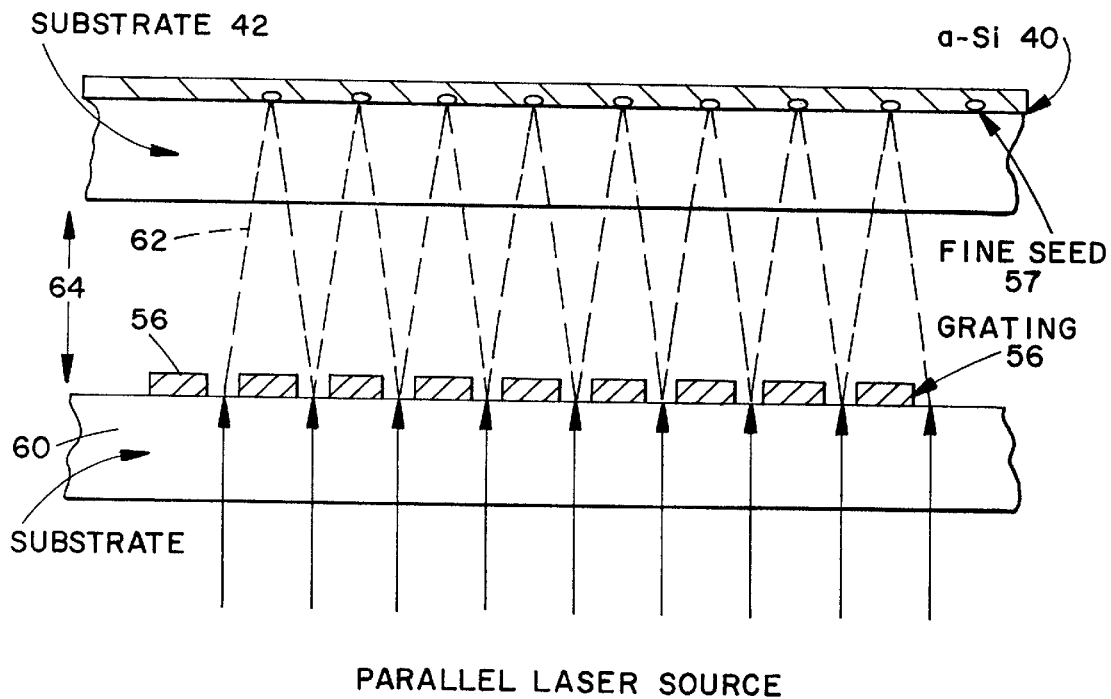

With additional attention to the use of a backside interference pattern for making fine nucleation seeds, as disclosed by FIG. 3D, grating mask 56 can alternatively be made on a separate substrate 60, such as quartz, which is placed near but not on backside of substrate 42, such as was done in the embodiment of FIG. 3C. The advantage of the method and structure of FIG. 3D is the flexibility of developing a desired pitch on interference pattern 62 by adjusting the distance 64 between substrate 42 and grating mask 56.

Figure 3E:
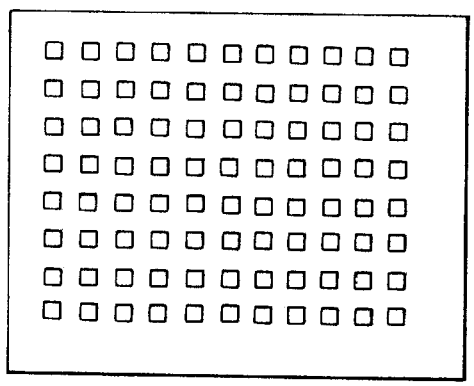
FIGS. 3E and 3F show a view of the apertures of a grating mask.
Figure 3F:
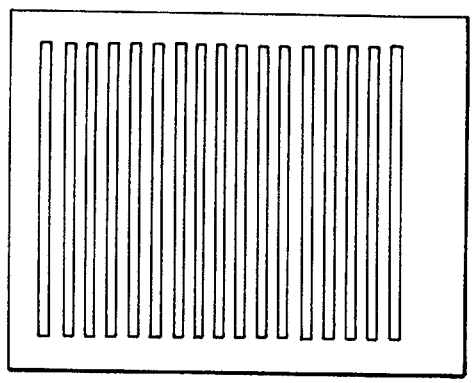

As particularly illustrated in FIGS. 3E and 3F, grating mask 56 can, among other configurations, be a matrix of open dots or a set of slits, depending on the particular application.

Figure 3G:
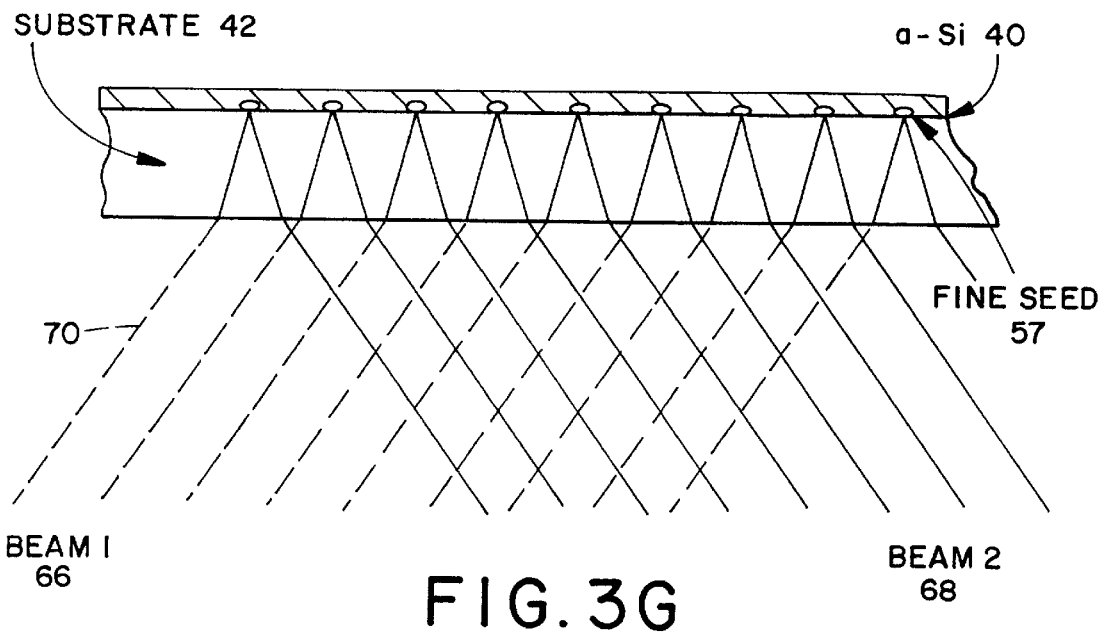

With attention to another embodiment of interference backside seeding, FIG. 3G illustrates that the fine buried seeds 57 of a periodic pattern can also be generated by multi-beam interference through the use of a first beam 66 and a second beam 68. In this situation, the pitch of the interference pattern 70 is determined by the arrangement of first beam 66 and second beam 68.

Returning attention to FIG. 4, once the backside irradiation methods described in connection with FIGS. 3A–3D and 3G are completed, crystallization of the remaining uncrystallized a-Si 40 is undertaken by the application of a crystallization pulse 72 on the front-side of a-Si 40, causing large grain growth at predetermined locations, in accordance with the previous grain growth explanation.

It is to be noted that energy, $E_{Seed}$, for backside seeding is much smaller than the crystallization energy, $E_{crystal}$ This is true since the area which is affected by the backside irradiation is much smaller and shallower than the front side area.

It is also to be appreciated that the present invention can be implemented with other types of crystallization, including solid phase crystallization.

The depth of the seeds in the a-Si is controlled by the laser wavelength, the energy density, and the substrate thermal transport properties. For example, increasing energy density will increase the depth of the formed nucleation seeds. It is appreciated that the specific relationships between the above noted parameters to adjust grain depth would be known by those skilled in the art.

Figure 5A:
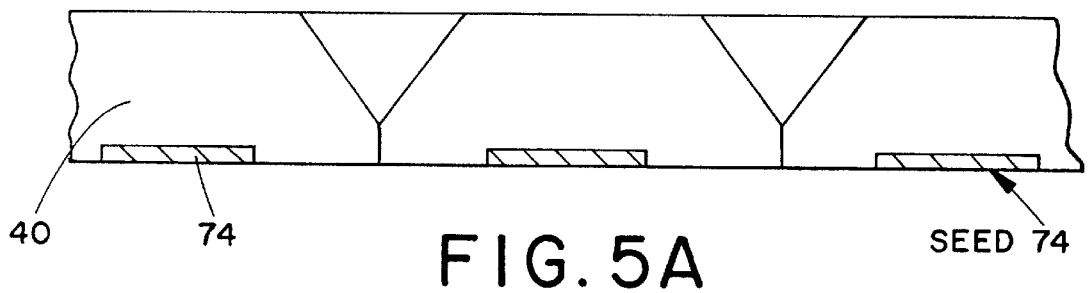
FIGS. 5A and 5B illustrate 3-D and lateral grain growth.
Figure 5B:
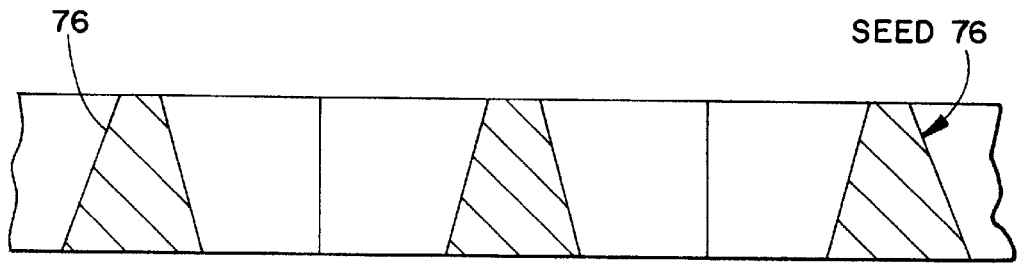

Two types of grain growth, i.e. 3-D growth 74, FIG. 5A, and lateral growth 76, FIG. 5B, are realized when seeds are formed at different depths in the a-Si matrix 40.

For 3-D grain growth 74, a low laser energy density (slightly above the interface melting threshold) is applied, which produces microcrystalline grains at the interface, as illustrated in FIG. 5A. The 3-D grain growth is then realized by subsequent front side laser crystallization having energy $E_{crystal}$.

For lateral grain growth 76, a laser energy near the melt-through threshold is applied resulting in a seed growth, as illustrated in FIG. 5B. The lateral grain growth is realized by front side crystallization with a proper laser energy which results in a complete melt in the remaining a-Si regions and a partial melt in the poly-Si regions, due to the different melting temperatures of the two materials. While it is understood that a seeding structure of FIG. 5B could be produced by a front-side laser irradiation through a mask, it is noted that with backside seeding there is no processing applied to the front surface. Due to this, the front surface is clean and ready for subsequent device processing.

Figure 6:
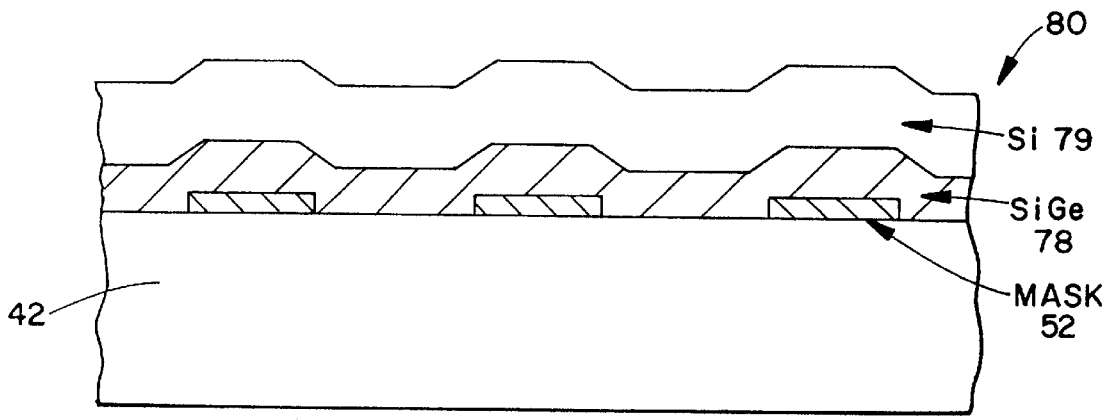
FIG. 6 provides an example of backside laser irradiation with a multi-layer film structure.

The above seeding methods and structures can be used with multi-layer film configurations. FIG. 6 illustrates an example of SiGe 78 and Si 79 multi-layer film 80. Backside seeding is performed on the SiGe layer 78. It is known that the SiGe has a lower melting temperature compared with Si 79. When the laser energy is higher than amorphous SiGe melting threshold but smaller than that of amorphous Si, the crystallization of the seeding layer will, therefore, stop abruptly at the interface of Si/SiGe, even with explosive crystallization. The front side crystallization utilizes the SiGe grain seeds if the energy and the Ge concentration are controlled so that the temperature at the amorphous/crystalline interface is higher than the a-Si melting temperature but lower than the poly-SiGe melting temperature.

It is noted that use of the backside irradiation described above is useful for forming nucleation sites for the formation of large grain sizes at predetermined locations in thin film construction. Another application of the seeding process is described in the production of single crystalline Si at the specific device locations or producing poly-Si grains with a uniform sized distribution over a large area.

Figure 7A:
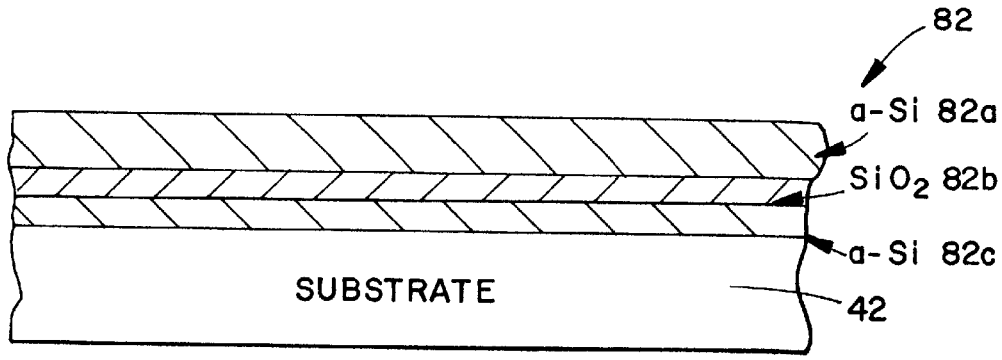
FIGS. 7A–7C provide an application of using the subject method and configuration for fabrication of MEMs structures.
Figure 7B:
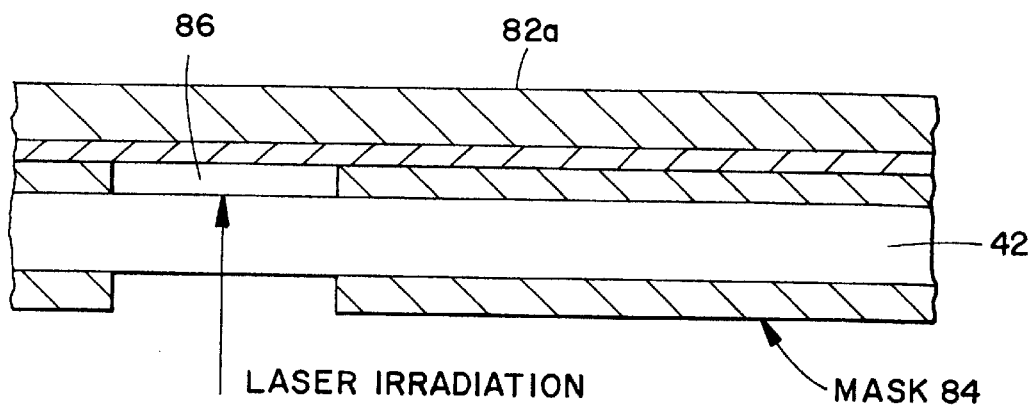

The described methods and structures can also be extended to the making of MEMS configurations, as illustrated in connection with FIGS. 7A–7C, which illustrate an example of constructing a silicon cantilever by backside crystallization and selective etching of a-Si using a H plasma. First, a multi-layer of a-Si/SiO$_2$/a-Si 82 is deposited on a glass or quartz substrate as shown in FIG. 7A. A mask 84 is patterned on the backside of substrate 42. A buried poly-Si region 86 is then produced by backside crystallization as illustrated in FIG. 7B. As previously mentioned, mask 84 on the backside of substrate 42 can produce undesirable fringes. However, the fine features in this case will be etched off in later processing. The surface a-Si 82*a* layer is crystallized by front side crystallization, in a known manner. The cantilever shape is patterned and formed by H plasma etching (H plasma selectively etches a-Si over poly-Si).

Figure 7C:
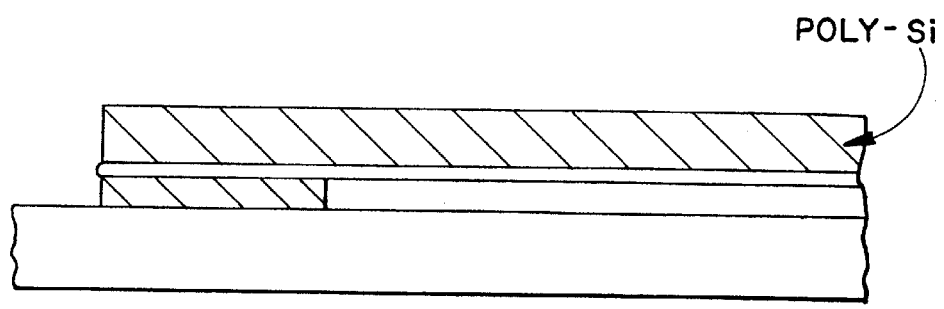

Alternatively, as set forth in FIG. 7C, the MEMS structure can be made by a front side crystallization of patterning of the first a-Si 82*c* layer, followed by deposition of the SiO$_2$ 82*b* and a-Si 82*a* layers. The advantage of the first mentioned method is having a continuous 3-layer deposition to simplify the processing. The method of H plasma selective etching of a-Si can be applied to other kinds of MEMS structures.

The invention has been described with reference to the preferred embodiment. Obviously, modifications and alterations will occur to others upon a reading and understanding of this specification. It is intended to include all such modifications and alterations insofar as they come within the scope of the appended claims or the equivalence thereof.

Having thus described the invention, it is now claimed:

1. A method for forming a plurality of single silicon crystals over a substrate comprising:
   forming an amorphous silicon layer over a front-side of the substrate;
   forming a mask on a surface of the substrate;
   irradiating, with a laser beam, the amorphous silicon layer through the backside of the substrate at predetermined locations in accordance with a configuration of the mask, the irradiating providing poly-silicon nucleation sites near an interface region between the amorphous silicon layer and the frontside of the substrate at the predetermined locations; and
   crystallizing remaining sections of the amorphous silicon layer on the front-side of the substrate to form a plurality of single silicon crystals, wherein each of the plurality of single silicon crystals correspond to one of the plurality of nucleation sites.

2. The method according to claim 1 wherein the mask is formed on the backside of the substrate.

3. The method according to claim 1 wherein the mask is formed at the interface between the amorphous silicon layer and a front-side of the substrate.

4. The method according to claim 1 further including, forming additional film layers over the substrate, thereby building a multi-layer film structure.

5. The method according to claim 4 wherein the multi-layer film structure includes forming a SiGe layer over the front-side of the substrate and forming a-Si layer over the SiGe layer.

6. The method according to claim 1 wherein the irradiating step employs an excimer laser as the laser beam.

7. The method according to claim 1 wherein the crystallizing step includes crystallizing the remaining sections of the amorphous silicon layer with a second laser beam.

8. The method according to claim 1 wherein the crystallizing step is accomplished by solid phase crystallization.

9. A method for forming a plurality of single silicon crystals over a substrate comprising:
   forming an amorphous silicon layer over a front-side of the substrate;
   forming a grating mask over a backside of the substrate;
   producing a laser beam directed to the backside of the substrate so as to pass through the grating mask;
   generating an interference pattern by the interaction of the grating mask and laser beam;
   irradiating the amorphous silicon layer through the backside of the substrate at predetermined locations, in accordance with the generated interference pattern, the irradiating producing nucleation sites near an interface region between the amorphous silicon layer and the front-side of the substrate; and
   crystallizing remaining sections of the amorphous silicon layer to form a plurality of single silicon crystals, wherein each of the plurality of single silicon crystals correspond to one of the plurality of nucleation sites.

10. The method according to claim 9 wherein the step of generating an interference pattern includes, using a parallel laser source.

11. The method according to claim 10 wherein,
   the parallel laser source is a laser beam of 308 nm wavelength, the grating mask has a grating of 15 $\mu$m periodicity and, thereby forming an intensity pattern of 10 $\mu$m periodicity.

12. The method according to claim 11 wherein with a coherence length of the laser beam being substantially 1 mm, a width of a feature formed at the interface of the amorphous silicon and the substrate is less than 1 $\mu$m.

13. The method according to claim 9 wherein the crystallizing step includes crystallizing the remaining sections of the amorphous silicon layer with a second laser beam.

14. The method according to claim 9 wherein the crystallizing step is accomplished by solid phase crystallization.

15. The method according to claim 9 wherein the step of generating an interference pattern includes:
   providing another substrate separate from the substrate by a predetermined distance;
   carrying the grating mask on the another substrate; and
   directing a laser beam through the grating mask towards the backside of the substrate, wherein selection of the distance between the substrate and the grating mask adjusts a pitch of the interference pattern.

16. The method according to claim 9 wherein the grating mask is formed by at least one of a matrix of open-dots and a set of slits.

17. The method according to claim 9 wherein the laser beam is from an excimer laser.

18. A method of forming a plurality of single silicon crystals over a transparent substrate comprising:

forming an amorphous silicon layer over a front side of the transparent substrate;

selecting an angle of a first laser beam;

selecting an angle of a second laser beam;

irradiating the first and second laser beams to the backside of the transparent substrate, thereby forming a desired pitch of an interference pattern, used to generate nucleation sites in the amorphous silicon; and crystallizing remaining sections of the amorphous silicon.

19. The method according to claim 18 wherein the crystallizing step includes crystallizing the remaining sections of the amorphous silicon by use of one of, (i) a third laser beam through the front side of the transparent substrate and (ii) solid phase crystallization.

* * * * *